United States Patent
Lan et al.

(10) Patent No.: US 7,093,777 B2
(45) Date of Patent: Aug. 22, 2006

(54) JET CLEAN NOZZLE WITH MULTIPLE SPRAY OPENINGS

(75) Inventors: Chih Lung Lan, Ruei Suei Hsiang (TW); An Shen Hwang, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 138 days.

(21) Appl. No.: 10/761,692

(22) Filed: Jan. 20, 2004

(65) Prior Publication Data

US 2005/0156061 A1   Jul. 21, 2005

(51) Int. Cl.
*A62C 2/08*   (2006.01)
*A62C 31/00*  (2006.01)
*B05B 7/08*   (2006.01)
*B05B 1/14*   (2006.01)
*B05B 7/10*   (2006.01)

(52) U.S. Cl. .............. 239/548; 239/549; 239/552; 239/553.5; 239/398; 239/399; 239/400; 239/406

(58) Field of Classification Search ........... 239/548, 239/549, 552, 553.5, 398, 399, 400, 406, 239/419
See application file for complete search history.

(56) References Cited

U.S. PATENT DOCUMENTS

| 4,302,040 | A | * | 11/1981 | Lazar ................. 239/288 |
| 5,783,044 | A | * | 7/1998 | Schneider et al. ...... 162/278 |
| 6,016,969 | A | * | 1/2000 | Tilton et al. ................ 239/1 |
| 6,113,002 | A | * | 9/2000 | Finkbeiner ............. 239/106 |
| 6,715,701 | B1 | * | 4/2004 | Julien ..................... 239/596 |

* cited by examiner

*Primary Examiner*—Davis Hwu
(74) *Attorney, Agent, or Firm*—Tung & Associates

(57) ABSTRACT

A jet clean nozzle having multiple spray openings which increase the scan density of pressurized water sprayed against the surface of a semiconductor wafer. The jet clean nozzle includes a nozzle body for attachment to a nozzle adaptor that communicates with a water jet pump. Multiple spray chambers extend into the nozzle body, and a spray opening communicates with each spray chamber. In use, pressurized water is forced through the respective spray openings and ejected from the spray chambers as multiple water jets.

14 Claims, 2 Drawing Sheets

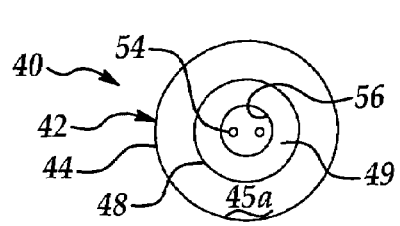
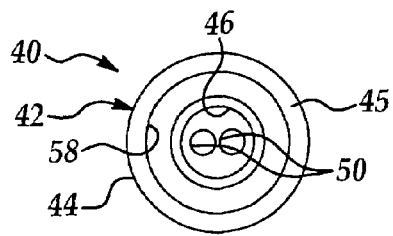
*Figure 4*   *Figure 5*
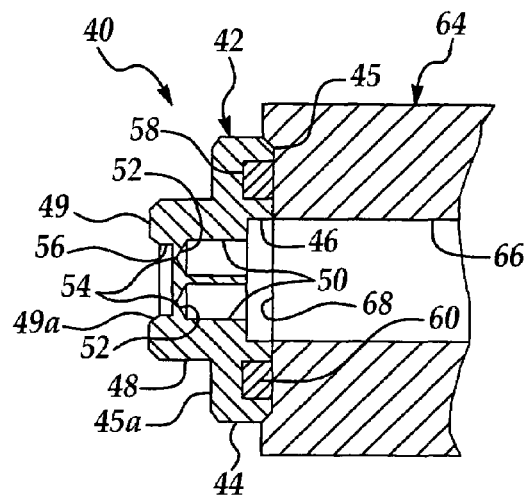
*Figure 6*
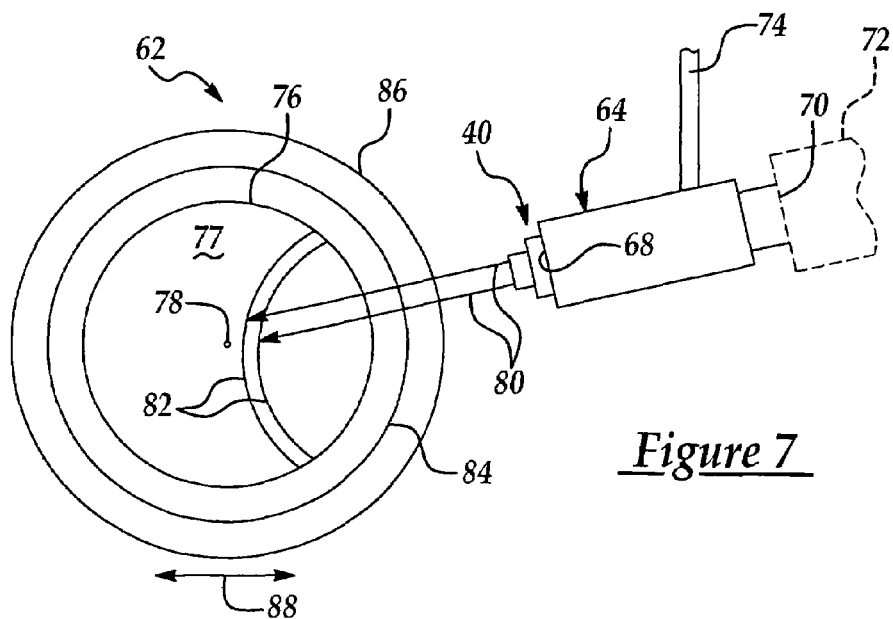
*Figure 7*

JET CLEAN NOZZLE WITH MULTIPLE SPRAY OPENINGS

FIELD OF THE INVENTION

The present invention generally relates to a method for the scrubber cleaning of semiconductor wafers having a surface coating, and more particularly, to a scrubber cleaner jet clean nozzle having multiple spray openings for increasing the jet scan density and enhancing the rate of particle removal on a semiconductor wafer during a scrubber cleaning process.

BACKGROUND OF THE INVENTION

In the fabrication process for semiconductor devices, numerous fabrication steps, as many as several hundred, must be executed on a silicon wafer in order to complete integrated circuits on the wafer. Since the processing of silicon wafers requires extreme cleanliness in the processing environment to minimize the presence of contaminating particles or films, the surface of the silicon wafer is frequently cleaned after each processing step. For instance, the wafer surface is cleaned after the deposition of a surface coating layer such as oxide or metal. A frequently-used method for cleaning the wafer surface is a wet-scrubbing method.

In cleaning a wafer surface by a wet scrubbing method, a wafer is rotated at a high speed, i.e., at least about 200 RPM and preferably, about 1,000 RPM, simultaneously with a jet of high-pressure de-ionized water sprayed on top or back surface. The water jet is normally sprayed at a pressure of about 5 to about 10 MPA. The water movement on top of the wafer surface displaces any contaminating particles that are lodged on the wafer surface.

A cleaning process is widely used after a deposition step. The fell-on particle (particle on deposition surface) after deposition such as metal or oxide layer deposition can be removed by a jet scrubbing method. By using high-pressured de-ionized water, the particle on a flat film (deposition surface) will be easily removed.

The pressure of de-ionized water can be controlled to maintain a particle removal rate by adjusting a jet pump pressure. The higher pressure achieves a better particle removal rate. On the other hand, higher pressure may induce damage on a wafer surface. A limitation pressure is set up to avoid this situation. In order to improve a particle removal rate, extending the process time is the only way to achieve such a goal. Although extending the process time will increase the production duration. A novel jet clean nozzle having multiple spray openings is introduced to provide a high particle removal rate and efficient productivity.

FIG. 1 illustrates a silicon wafer 10 the upper surface of which is scanned in a water jet scrubbing method using a conventional wafer scrubbing apparatus 8. The wafer 10 is normally positioned on a wafer platform 17 which is typically rotatably mounted on a wafer stage 16. The wafer platform 17 rotates the wafer 10 at a predetermined rotational speed, which may be between typically about 200 RPM and about 2,000 RPM.

The wafer scrubbing apparatus 8 typically includes a nozzle adaptor 26 which is mounted on a support rack 28. A nozzle 30, having a single nozzle opening 32, is provided on the nozzle adaptor 26, as shown in FIG. 1A. A jet pump (not shown) is connected to an inlet end 27 of the nozzle adaptor 26 to pump water through the nozzle adaptor 26 and nozzle 30. A water jet 22 of de-ionized water is ejected onto the upper surface of the wafer 10 from the single nozzle opening 32 of the nozzle 30. The water jet 22 has a water pressure of typically about 50 kg/cm$^2$.

As it strikes the surface of the wafer 10 at an angle of typically about 45°, the water jet 22 is scanned along a top of the wafer surface by a lateral sweeping motion of the water jet nozzle 26 to define a generally curved or arcuate trace 12 which normally traverses the center 14 of the wafer 10, as illustrated in FIG. 2. The surface of the wafer 10 is scanned by the water jet 22 at least once, and preferably, several times. Centrifugal force acting on the water flow on the surface of the wafer 10 due to the rotating wafer platform 17 and wafer 10 removes contaminating particles or films from the surface of the wafer 10.

It has been found that horizontal movement of the wafer stage beneath the water jet nozzle during the scrubbing process provides a more uniform dispersement of the sprayed water along the entire surface of the disc. This has been found to substantially improve removal of organic particles from the wafer which would otherwise tend to remain at the wafer center due to reduced centrifugal force at the center, as well as reduce the water spray-induced damage to low-density film coatings at the wafer center by spreading the impact energy of the spray across a larger surface area on the wafer.

The cleaning efficiency of the water jet 22 ejected from the nozzle 30 depends on various factors including the pressure and size of the water jet 22, as well as the scan density of the water jet 22 on the wafer 10. It is well-known that ejecting a water jet of high scan density onto the surface of a wafer effectively removes particles from the wafer. However, the scrubber cleaning cycle for each wafer is typically subjected to a timing limitation. This timing limitation, which is typically about 45 seconds, depends mainly on the size of the jet pump used to force the water through the nozzle adaptor 26 and out the single spray opening 32 of the nozzle 30.

Frequently, the typically 45-second scrubber cleaning cycle time of the wafer scrubbing apparatus is inadequate to sufficiently remove particles from a wafer. Thus, the wafer must be subjected to a second scrubber cleaning cycle time to remove the remaining particles from the wafer. However, this adversely affects wafer throughput. Accordingly, a jet clean nozzle having multiple openings is needed to increase the scan density of water jets on a wafer during a scrubber cleaning process and increase the wafer-cleaning efficiency during a scrubber cleaning cycle of typically limited duration.

An object of the present invention is to provide a novel jet clean nozzle having multiple openings.

Another object of the present invention is to provide a novel multi-aperture jet clean nozzle which is capable of increasing the scan density of water ejected against the surface of a wafer.

Still another object of the present invention is to provide a novel jet clean nozzle which enhances the wafer-cleaning efficiency of a scrubber cleaning apparatus.

Yet another object of the present invention is to provide a novel jet clean nozzle which is capable of contributing to an enhanced yield of IC devices fabricated on a semiconductor wafer.

A still further object of the present invention is to provide a novel jet clean nozzle which contributes to the thorough cleaning of a wafer surface within a scrubber clean cycle of limited duration.

SUMMARY OF THE INVENTION

In accordance with these and other objects and advantages, the present invention is generally directed to a novel jet clean nozzle having multiple spray openings which increase the scan density of pressurized water sprayed against the surface of a semiconductor wafer. The jet clean nozzle includes a nozzle body for attachment to a nozzle adaptor that communicates with a water jet pump. Multiple spray chambers extend into the nozzle body, and a spray opening communicates with each spray chamber.

In use, the water jet pump forces water through the nozzle adaptor and into each spray chamber of the jet clean nozzle. The pressurized water is ejected from the spray chambers through the respective spray openings. The pressurized water leaves the spray openings of the nozzle body as multiple water jets. The water jets strike the wafer in multiple, arcuate traces across the surface of the wafer as the nozzle adaptor is typically moved in a side-to-side motion.

Accordingly, compared to a single water jet ejected from a conventional nozzle, the multiple scanning water jets increase the scan density of pressurized water against the wafer surface. This significantly enhances the removal of particles from the surface of the wafer during a comparable period of time. Consequently, it is normally not necessary to prolong the scrubber cleaning cycle for each wafer or subject the wafer to multiple scrubber cleaning cycles in order to adequately remove particles from the wafer surface.

BRIEF DESCRIPTION OF THE DRAWINGS

The invention will now be described, by way of example, with reference to the accompanying drawings, in which:

FIG. 4 is a front view of the jet clean nozzle with multiple spray openings of the present invention;

FIG. 5 is a rear view of the jet clean nozzle with multiple spray openings;

FIG. 6 is a cross-section of the jet clean nozzle with multiple spray openings of the present invention, mounted on a nozzle adaptor (partially in section); and FIG. 7 is a schematic of a wafer scrubbing apparatus in implementation of the jet clean nozzle with multiple spray openings of the present invention.

DETAILED DESCRIPTION OF THE INVENTION

The present invention has particularly beneficial utility in the rinsing of particles from the surface of a semiconductor wafer during the fabrication of integrated circuit devices on the wafer. However, the invention is not so limited in application, and while reference may be made herein to the rinsing of semiconductor wafers, the invention is equally adaptable to the rinsing of particles from substrates in a variety of industrial applications.

Figure 1:
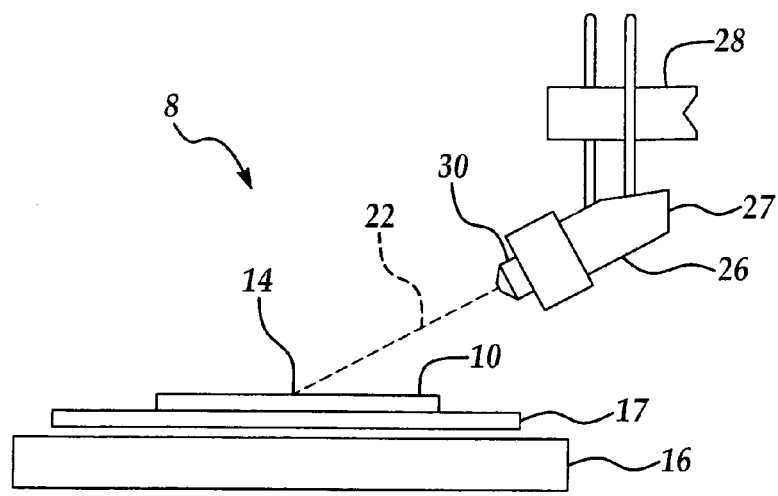
FIG. 1 is a side, partially schematic, view of a conventional wafer scrubbing apparatus cleaning a wafer.
Figure 1A:
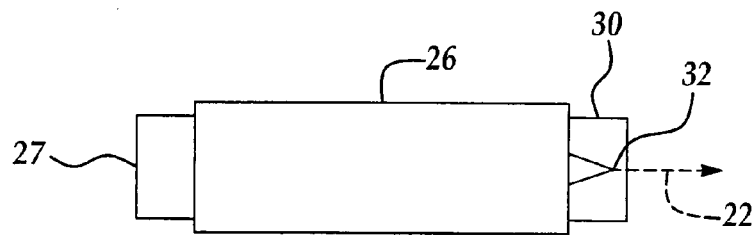
FIG. 1A is a schematic of a typical conventional nozzle adaptor and jet clean nozzle having a single spray opening.
Figure 2:
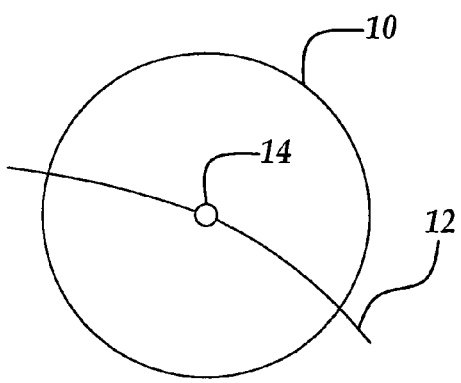
FIG. 2 is a top view of a semiconductor wafer, illustrating an arcuate trace formed across the surface of the wafer by a scanning water jet ejected from a jet clean nozzle having a single spray opening.
Figure 3:
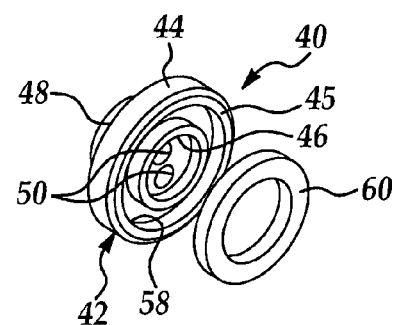
FIG. 3 is a rear, exploded perspective view of a jet clean nozzle with multiple spray openings according to the present invention.

Referring to FIGS. 3–6, an illustrative embodiment of the jet clean nozzle of the present invention is generally indicated by reference numeral 40. The jet clean nozzle 40 includes a nozzle body 42 having a generally cylindrical base portion 44. An annular seal recess 58, which contains an annular gasket 60, such as an O-ring, as hereinafter further described, is provided in a rear surface 45 of the base portion 44. A circular inlet chamber 46 is further provided in the rear surface 45 of the base portion 44, in generally concentric relationship to the seal recess 58.

The nozzle body 42 typically further includes a cylindrical neck portion 48 which extends beyond a front surface 45a of the base portion 44. The neck portion 48 terminates in an annular nozzle flange 49 which may have an inner bevel 49a, as shown in FIG. 6. A circular spray recess 56 is circumscribed by the annular nozzle flange 49.

As further shown in FIG. 6, multiple spray chambers 50, each of which typically has a generally elongated, cylindrical configuration, extend through the nozzle body 42, forwardly from the inlet chamber 46 and toward the spray recess 56. Typically, two adjacent, parallel spray chambers 50 extend through the nozzle body 42, although the invention may include three or more spray chambers 50. Each spray chamber 50 typically includes an annular, tapered front wall 52.

A spray opening 54 extends from the center of the tapered front wall 52 of each spray chamber 50, through the nozzle body 42, and opens into the spray recess 56. Accordingly, the multiple spray openings 54 establish fluid communication between the respective spray chambers 50 and the circular spray recess 56. Each spray opening 54 is cut through the nozzle body 42 typically using a laser beam (not shown), according to the knowledge of those skilled in the art.

Preferably, each spray opening 54 has a diameter of typically about 0.075~0.5 mm. Most preferably, each spray opening 54 has a diameter of typically about 0.1 mm. Such a diameter range for each of the spray openings 54 facilitates optimal rinsing of particles from the surface of a wafer while preventing damage to films and devices being fabricated on the wafer surface.

Referring next to FIGS. 6 and 7, in use the jet clean nozzle 40 is mounted on a nozzle adaptor 64 of a wafer scrubbing apparatus 62, which may be conventional. The nozzle adaptor 64 typically includes an outlet end 68 and an inlet end 70, which is provided in fluid communication with a water jet pump 72 (shown in phantom in FIG. 7). A flow channel 66 extends from the inlet end 70 to the outlet end 68, as shown in FIG. 6.

As further shown in FIG. 6, the nozzle body 42 is mounted on the outlet end 68 of the nozzle adaptor 64, typically by threaded attachment or using any other suitable techniques known by those skilled in the art. The gasket 60 is seated in the seal recess 58 of the nozzle body 42 and tightly engages the outlet end 68 of the nozzle adaptor 64. The inlet chamber 46 of the nozzle body 42 is disposed in alignment with the flow channel 66 of the nozzle adaptor 64.

As shown in FIG. 7, the wafer scrubbing apparatus 62 typically includes a support rack 74 on which the nozzle adaptor 64 is mounted. The nozzle adaptor 64 is typically pivotally mounted on the support rack 74 and is engaged by a pivoting mechanism (not shown) for pivoting the nozzle adaptor 64 in a back-and-forth motion, typically in conventional manner. A semiconductor wafer 76 to be rinsed is supported on a wafer platform 84 which is rotatably mounted on a wafer stage 86. The wafer platform 84 rotates the wafer 76 as multiple water jets 80 are ejected from the jet clean nozzle 40, against the surface of the wafer 76, and as the nozzle adaptor 64 is pivoted in a side-to-side motion, as hereinafter further described.

According to a typical method of using the jet clean nozzle 40 of the present invention in a scrubber cleaning process, a wafer 76 having a film 77 coated on the upper surface thereof is initially positioned on the wafer platform 84. The film 77 may be an insulative film, such as fused silicate glass (FSG), for example, or a metal conductive film coated on the wafer 76. Typically, the scrubber cleaning process using the jet clean nozzle 40 is carried out after a deposition or etching process is carried out on the film 77, to remove particulate contaminants from the film 77 which would otherwise tend to contaminate IC devices being fabricated on the wafer 76.

As the wafer platform 84 is rotated on the wafer stage 86 at a speed of from about 200 rpm to about 2,000 rpm, and preferably, about 1,000 rpm, the wafer stage 86 may be driven along tracks (not shown), toward and away from the nozzle adaptor 64. Simultaneously, the jet pump 72 forces water or other rinsing fluid through the flow channel 66 (FIG. 6) of the nozzle adaptor 64; into the circular inlet chamber 46 of the nozzle body 42; and through the multiple spray chambers 50, from which the water or fluid exits through the respective spray openings 54. Accordingly, the pressurized water leaves the spray openings 54 as respective multiple water jets 80, which strike the film 77 on the wafer 76. The jet pump 72 pumps the water or other rinsing fluid through the flow channel 66 at a pressure of typically about 5 Mpa.

The water jets 80 ejected from the jet clean nozzle 40 may have a pressure of at least typically about 50 kg/cm$^2$. As the wafer stage 86 moves the wafer platform 84 and rotating wafer 76 in the direction indicated by the arrow 88, the nozzle adaptor 64 is typically pivoted on the support rack 74 in a lateral, sweeping motion to eject the water jets 80 onto the film 77 in such a manner as to define multiple curved, parallel traces 82 across the surface of the film 77 on the wafer 76. The multiple traces 82 are successively formed by the sweeping water jets 80 across at least one half of the surface area of the film 77 on the wafer 76, as shown in FIG. 7, as the wafer stage 86 is advanced horizontally for a distance which typically corresponds to the radius of the wafer 76.

Alternatively, the wafer stage 86 may be advanced for a distance which corresponds to the diameter of the wafer 76. In that case, the multiple sweeping water jets 80 define multiple traces 82 across the entire surface area of the film 77 on the rotating wafer 76 for each sweep of the nozzle adaptor 64. The multiple traces 82 may be made on the film 77 across the various sections of the wafer 76 either once or multiple times, as needed.

The formation of multiple traces 82, rather than one trace, across the film 77 on the wafer 76 for each lateral sweeping motion of the nozzle adaptor 64 expedites dispersement of the sprayed water or other scrubbing fluid along the entire surface of the film 77. This substantially improves removal of particles from the wafer 76 which would otherwise tend to remain at the wafer center 78 due to reduced centrifugal force at the wafer center 78. Furthermore, the efficiency of the scrubber cleaning operation is enhanced in such a manner that one scrubbing cycle of typically about 45 seconds is necessary to thoroughly remove particles from the wafer 76. This renders unnecessary prolongation of the scrubbing cycle time or repeating of the scrubbing cycle, thereby increasing the throughput of wafers.

While the preferred embodiments of the invention have been described above, it will be recognized and understood that various modifications can be made in the invention and the appended claims are intended to cover all such modifications which may fall within the spirit and scope of the invention.

What is claimed is:

1. A jet clean nozzle comprising:
   a nozzle body;
   a plurality of spray chambers provided in said nozzle body, said spray chambers having a longitudinal axis parallel to a longitudinal axis of an inlet chamber, said inlet chamber disposed in said nozzle body for supplying a spray liquid to each of said spray chambers; wherein each of said plurality of spray chambers is provided in fluid communication with said inlet chamber
   a plurality of spray openings provided in fluid communication with said plurality of spray chambers respectively, each of said plurality of spray openings for spraying said spray fluid supplied from a respective spray chamber; and
   a pivotable support rack for mounting said nozzle body, said support rack laterally pivotable to sweep a plurality of jet sprays produced from said plurality of spray openings laterally across target surface.

2. The jet clean nozzle of claim 1 further comprising a spray recess provided in said nozzle body and wherein said plurality of spray openings extend between said plurality of spray chambers, respectively, and said spray recess.

3. The jet clean nozzle of claim 1 wherein each of said plurality of spray openings has a diameter of from about 0.075 mm to about 0.5 mm.

4. The jet clean nozzle of claim 1 further comprising a spray recess provided in said nozzle body and wherein said plurality of spray openings extend between said plurality of spray chambers, respectively, and said spray recess.

5. A jet clean nozzle comprising:
   a nozzle body;
   a nozzle body;
   a plurality of elongated, generally cylindrical, parallel spray chambers provided in said nozzle body, said spray chambers having a longitudinal axis parallel to a longitudinal axis of an inlet chamber, said inlet chamber provided in said nozzle body upstream of said spray chambers;
   a plurality of spray openings provided in fluid communication with said plurality of spray chambers, respectively, each of said plurality of spray openings for spraying said spray fluid supplied from a respective spray chamber;
   wherein each of said plurality of spray chambers is provided in fluid communication with said inlet chamber, said inlet chamber for supplying a spray liquid to each of said spray chambers; and
   an annular, generally tapered front wall in each of said plurality of spray chambers wherein a respective spray opening extends through said tapered front wall in each of said plurality of spray chambers.

6. The jet clean nozzle of claim 5 wherein each of said plurality of spray openings has a diameter of from about 0.075 mm to about 0.5 mm.

7. The jet clean nozzle of claim 5 wherein said inlet chamber is generally circular.

8. The jet clean nozzle of claim 5 further comprising a generally circular spray recess provided in said nozzle body and wherein said plurality of spray openings extend between said plurality of spray chambers, respectively, and said spray recess.

9. The jet clean nozzle of claim 8 wherein each of said plurality of spray openings has a diameter of from about 0.075 mm to about 0.5 mm.

10. The jet clean nozzle of claim 5 further comprising a pivotable support rack for mounting said nozzle body, said support rack laterally pivotable to sweep a plurality of jet sprays produced from said plurality of spray openings laterally across a target surface.

11. A jet clean nozzle comprising:
 a nozzle body having a base portion and a neck portion extending from said base portion;
 a plurality of elongated, generally cylindrical, parallel spray chambers provided in said nozzle body;
 a plurality of spray openings extending through at least a segment of said neck portion and provided in fluid communication with said plurality of spray chambers, respectively; and,
 a generally circular spray recess provided in said neck portion of said nozzle body and a nozzle flange circumscribing said spray recess, and wherein said plurality of spray openings extend between said plurality of spray chambers, respectively, and said spray recess.

12. The jet clean nozzle of claim 11 further comprising a generally circular inlet chamber provided in said base portion of said nozzle body and wherein each of said plurality of spray chambers is provided in fluid communication with said inlet chamber.

13. The jet clean nozzle of claim 11 wherein each of said plurality of spray openings has a diameter of from about 0.075 mm to about 0.5 mm.

14. The jet clean nozzle of claim 11 further comprising a pivotable support rack for mounting said nozzle body, said support rack laterally pivotable to sweep a plurality of jet sprays produced from said plurality of spray openings laterally across a target surface.

* * * * *